United States Patent [19]

Lunden

[11] 4,097,796
[45] Jun. 27, 1978

[54] METHOD FOR TESTING RADOMES

[75] Inventor: Clarence D. Lunden, Federal Way, Wash.

[73] Assignee: The Boeing Company, Seattle, Wash.

[21] Appl. No.: 769,852

[22] Filed: Feb. 18, 1977

[51] Int. Cl.² ............................................. G01R 27/04
[52] U.S. Cl. ............................. 324/58 B; 324/58.5 B
[58] Field of Search ...................... 324/58.5 R, 58.5 A, 324/58.5 B, 58.5 C, 58 R, 58 A, 58 B, 58 C; 343/703

[56] References Cited

U.S. PATENT DOCUMENTS

| | | | |
|---|---|---|---|
| 2,952,296 | 9/1960 | Kofoid | 324/58.5 A |
| 3,025,463 | 3/1962 | Luoma et al. | 324/58.5 B |
| 3,693,078 | 9/1972 | Sorger | 324/58 B |
| 3,936,736 | 2/1976 | Ray | 324/58 B |

Primary Examiner—Rudolph V. Rolinec
Assistant Examiner—Ernest F. Karlsen
Attorney, Agent, or Firm—Thomas H. Murray

[57] ABSTRACT

The radio-frequency performance at localized areas of a radome is determined by a method which includes illuminating at normal incidence a local radome patch with a sweep-frequency band of microwaves having a frequency band of at least two-thirds octave surrounding the design frequency of the radome. Alternatively, a harmonic band of three times the design frequency band may be utilized in the method when compact equipment is important. A sweep-frequency generator is coupled to a reflectometer for response to the band of illuminated and reflected microwaves from a local radome patch to provide an X-Y plot of reflectivity as a function of the sweep-frequency. The sweep-frequency is related to scan angle using known radome equations.

11 Claims, 5 Drawing Figures

METHOD FOR TESTING RADOMES

BACKGROUND OF THE INVENTION

This invention relates to a method for revealing local radio-frequency performance of a radome, and more particularly to a method which will enable the utilization of a compact hand-held device which can be moved about the surface area of a radome to determine whether patches thereof fail to match their original performance specification, either because of manufacturing errors, or because of degradation in the field.

The invention described herein may be manufactured and used by or for the Government of the United States of America for governmental purposes without the payment of any royalties thereon or therefor.

A radome made from resin-reinforced fiberglass is widely used on aircraft to smooth the airflow past the microwave radar antenna. The radome seals out the outside air but is made from dielectric material so as to transmit electromagnetic waves with little loss to the radar antenna. It is seldom possible to achieve an optimum radome because of design errors, manufacturing errors or the effects of weather and altitude which introduce water into the radome. It is a present practice to test the radome and associated microwave antenna to determine such variables as antenna bore-sight range, main beam loss, main beam deviation (bore-sight error) and sidelobe increase. However, after such testing is completed in the aircraft and radome-radar design stages, the testing is seldom, if ever, repeated. Such testing measures the overall radome performance, averaged over the antenna aperture, but fails to identify local portions of the radome which may fail to meet design specifications. The local portions of the radome which are referred to herein deal with an area which is relatively small and of the order of 3 inches in diameter whereas the radome itself is of the order of 3–30 feet in diameter.

After the aircraft-radome is placed into service, systematic performance testing of the radome is unlikely to ever occur. The forward-looking weather radar in an aircraft can be operated dome-up versus dome-down; however, the environment in the surrounding areas of airports produces radio-frequency clutter too overpowering to allow radome problems to be detected. Downlooking radar systems are "trapped" on the flight line. Entrapped liquid or moisture in the radome can be detected with the aid of a hand-held Q-meter which provides an indication of capacitance changes due to the presence of water. These Q-meters operate at about 10 megahertz and while they detect trapped water, they fail to provide meaningful data as to performance of the radome at microwave frequencies, e.g., C-band of 4 to 8 GHz, X-band of 8 to 12.5 GHz. More specifically, the Q-meter fails to reveal degrading of the radome performance particularly with regard to radome thickness changes, delamination, etc., all of which are vital to the performance of the radome.

SUMMARY OF THE INVENTION

It is an object of the present invention to provide a method for determining the radio-frequency performance of localized areas in a radome based on a concept to enable the use of a compact hand-held apparatus to facilitate the testing of localized patch areas of the radome.

It is a further object of the present invention to provide a method for determining radio-frequency performance at localized areas of a radome by illuminating a local radome patch, at normal incidence over a sweep-frequency band of one-half to two-thirds of an octave encompassing the design frequency of the radome, to simulate angle scanning of the radar beam transiting the radome.

More specifically, according to the present invention, there is provided a method for determining at a localized area of a radome, the radio-frequency reflectivity which is sensitive to delamination and/or other thickness changes to the radome after design or dielectric changes due to water entrapment. To pass electromagnetic waves at a prescribed frequency, the method includes the steps of illuminating at normal incidence a local radome path with a two-thirds octave sweep-frequency band of microwaves having a lower frequency of at least one-half octave lower than the radome design frequency, coupling a reflectometer for response to the band of illuminated and reflected microwaves directed onto and from the local radome patch, respectively, producing an X-Y plot corresponding to microwave reflectivity as the function of the microwave sweep-frequency. The X-Y plot is calibrated with a signal reflected from a dielectric slab, a block or a radome patch with a known radio-frequency performance. As both the device and its operating frequency are "swept" over the radome, the technique as well as its embodiment we have dubbed "Domesweeper".

The aforementioned method is further characterized by the use of radome equations to transpose the sweep-frequency band into a scan-angle band, thus producing a reflectivity-scan angle plot.

To minimize the size of component parts for carrying out the method of the present invention, the sweep frequency may be chosen at a radome harmonic passband. When the radome is of a fiberglass sandwich construction designed to operate at an S-band microwave frequency, this means that the sweep-frequency band includes three times the fundamental operating frequency of the radome or about 9 GHz. The concept for determining reflectivity versus frequency and the analogy of scan angle versus frequency remains valid. This derivative technique and its embodiment have been dubbed "Harmonic Domesweeper".

The method of the present invention further includes the use of a calibrator block to calibrate the reflectometer for meaningful determinations according to the method of the present invention. A sweep-frequency generator is preferably employed to provide the sweep-frequency band of microwaves which is propagated by a rectangular wavelength to an E-plan sectoral horn which is placed in a juxtaposed relation with the local radome patch to undergo testing by the method of the present invention.

Thus, the method of the present invention is addressed to the concept of illuminating a small patch on a radome at normal incidence so that the return wave can be processed by directional couplers with a nearly-collimated wave so that divergence will not attenuate the far-wall vector contributions to the total radome reflectivity. The apparatus chosen to propagate the microwaves according to the method of the present invention must be free of internal reflections which might mask radome reflections.

These features and advantages of the present invention as well as others will be more fully understood when the following description is read in light of the accompanying drawings, in which.

Figures 1, 2:
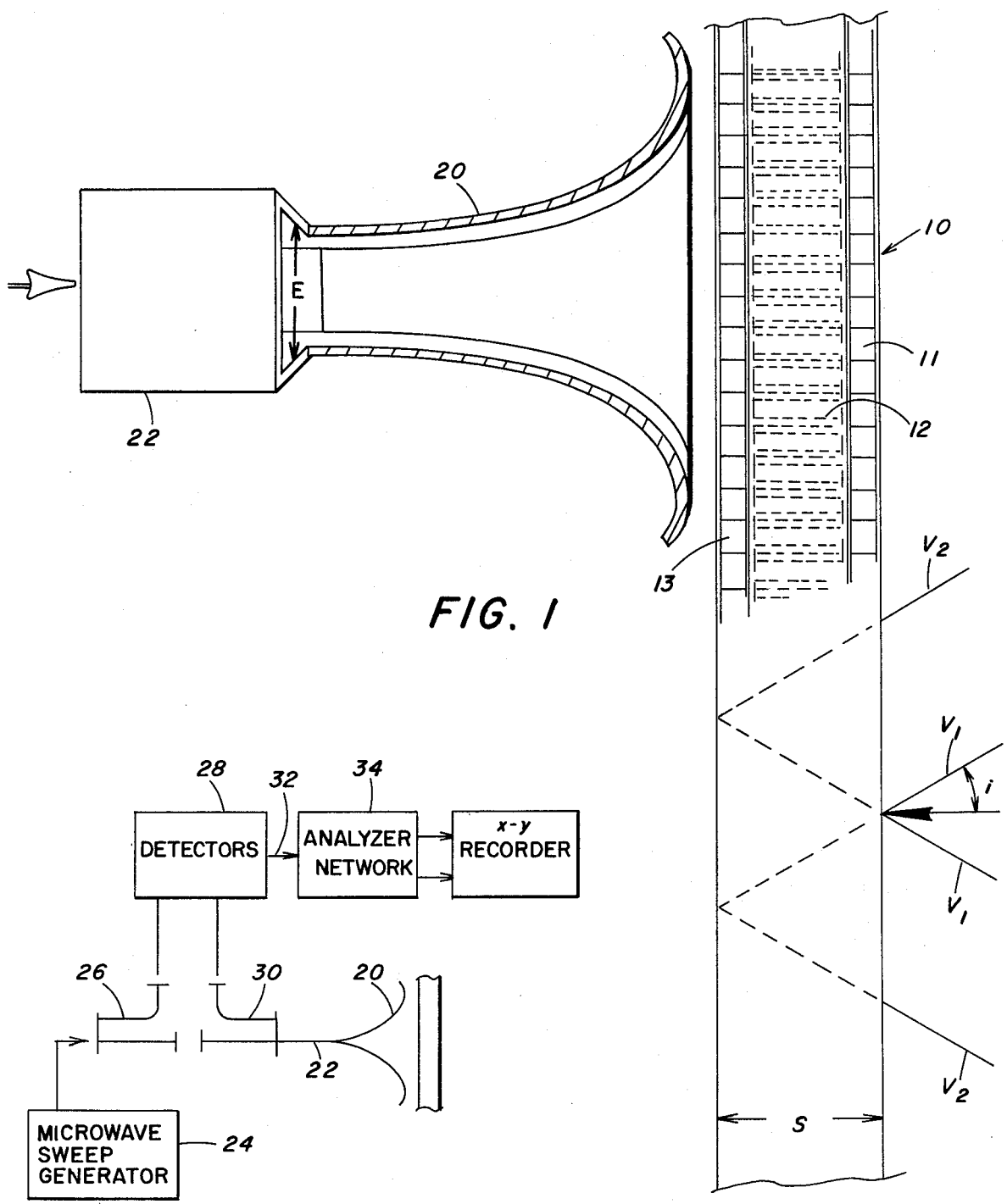
FIG. 1 is an enlarged view of a radome and apparatus associated therewith for carrying out the method of the present invention.
FIG. 2 is a schematic view of the preferred apparatus to carry out the method of the present invention.

In FIG. 1, reference numeral 10 designates a fragmented portion in cross section of a radome to typically illustrate the multilayered, sandwich construction. In a C-band radar system, it is typical that the radome is designed for operation at the prescribed frequency of 5 GHz. A sheet 11 of resin-bonded glass fibers is bonded onto one face surface of a honeycomb core section 12 and onto the other face surface of the core section 12 there is bonded a sheet of resin-bonded glass fibers 13. For the purpose of describing the method of the present invention, it will be assumed that the outer wall of the radome is defined by sheet 13 which may additionally include a layer of electrically-conductive paint to bleed-off static charges which otherwise tend to build up on the exposed face surface of the radome. The inner face surface of the radome is defined by the exposed face surface of sheet 11. The reflection of electromagnetic wave energy by the face surface of the inner wall 11 is given by expression (1) below and gives rise to reflection vectors $V_1$. The refraction of the radome 10 gives rise to reflection vectors $V_2$. The phase shift of reflection vectors $V_1$ and $V_2$ is related to the path difference given by the expression:

$$\delta \approx 2s \cos i \quad (1)$$

where:

$S$ is equal to the thickness of the radome wall, and i is equal to the angle of incidence.

The walls of the radome for a typical A-sandwich construction are spaced at a distance, $S$, at the design angle $i_o$ given approximately by the expression $$S = \eta \lambda_o/4 \text{ SEC } i_o \quad (2)$$

where $\eta$ equals a constant and $\lambda_o$ equals the design wavelength. The constant $\eta$ is equal to unity when the actual design wavelength is under discussion. Deviating from the design wavelength, $\lambda_o$, is analogous to deviating from the design scan angle, i.e., mathematically, $\lambda_o$ and SEC $i_o$ in expression (2) are in the first power and vary somewhat in a linear manner. By increasing the frequency of the microwave energy, i.e., shortening the wavelength, within a sweep-frequency band, one simulates angle scanning toward normal incidence. This unique concept overcomes the present-day procedure for angle scanning wherein relatively slow antenna range procedures are used.

The method of the present invention enables the use of a compact hand-held device for sweeping or scrubbing about the outer surface (air-side surface of the radome) to reveal radio-frequency performance of localized areas. The method is readily usable in design stages, manufacturing stages, flight-test operations and field-repair phases of the life cycle of the radome. In the method, a local radome patch is illuminated at normal incidence by an E-plane sectoral horn 20 which has a smooth E-plane roll of at least 90° to avoid abrupt truncations at broadwall currents. H-plane truncations can be quite abrupt as the currents run parallel to the truncation. The E-plane sectoral horn 20 is coupled to a rectangular waveguide 22 employed to propagate the electromagnetic waves at microwave frequencies to the horn from a microwave sweep generator 24 shown only in FIG. 2. It is an important feature of the present invention that the electromagnetic waves delivered to the waveguide 22 from the microwave sweep generator are delivered over a sweep-frequency band of about one-half to two-thirds octave approximately centered, in most cases, on the design frequency of the radome wall to undergo analysis. However, as discussed previously, a harmonic band, in the case of an A-sandwich radome, of three times the design frequency band may be used whereby wavelengths and consequently the dimensional size of the waveguide and E-plane sectoral horn can be substantially reduced. In expression (2) the constant becomes $\eta = 3$ and the wavelength at the design frequency of the new sweep-frequency band becomes $\lambda_o^1 = \lambda_o/3$. Thus, for example, in a C-band radar where the frequency is centered at 5 GHz, the sweep-frequency band of microwave energy delivered by the generator 24 will consist of approximately 4.0 GHz to 6.3 GHz when the band is defined to be two-thirds octave. On the other hand, when the fundamental frequency of the radome is in the C-band, the entire frequency band can be raised three-fold whereby the frequency band of microwaves propagated from the sweep-frequency generator is between approximately 12 GHz to 18.9 GHz. By definition, a second frequency is one octave greater than a first frequency when the ratio of the second to the first equals two. When a second frequency $f_2$ is described as "n" octaves greater than a first frequency $f_1$, then the second frequency equals two to the nth power times the first. In other words: $f_2 = 2^n(f_1)$. By way of example, if a second frequency is one-half octave greater than a first, then:

$$f_2 = 2^{\frac{1}{2}}(f_1) = \sqrt{2(f_1)} = 1.414 f_1. \quad (3)$$

In FIG. 2, the preferred form of system is disclosed to carry out the method of the present invention. The sweep-frequency band of microwave energy from generator 24 is delivered through a feed-forward coupler 26 to a detector circuit 28 and the reflected spectrum of microwave energy from the radome is fed through coupler 30 to detectors 28. The detectors provide an output signal in line 32 coupled to an analyzer network 34 which, in turn, provides X-Y coordinate signals for display by an X-Y recorder 36 relative to a Cartesian coordiante system.

Figure 3:
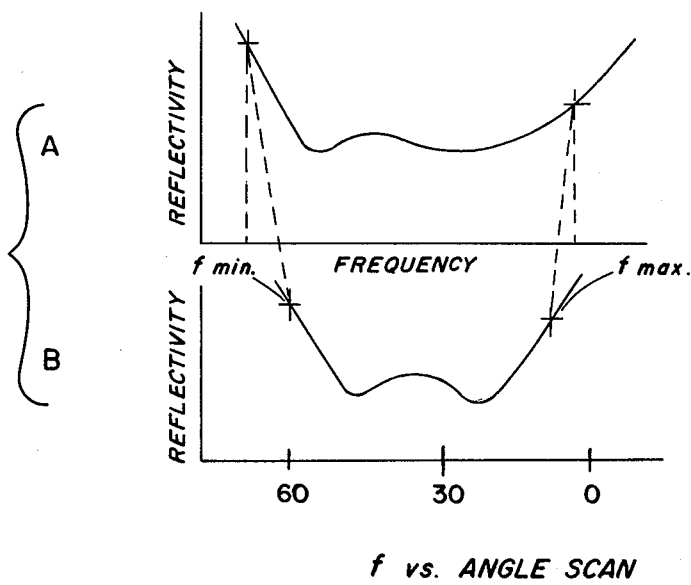
FIG. 3 illustrates, by graph A, a plot of frequency versus reflectivity and by graph B, a plot of frequency versus scan angle.

The output signal from the analyzer network 34 is in the form of a plot signal shown in graph A of FIG. 3 in an X-Y coordinate system such that a waveform 38 is produced representing reflectivity ($\rho$) plotted along the Y-axis and frequency ($f$) plotted along the X-axis. The frequency plotted along the X-axis represents the sweep-frequency band and is readily transposed by analogy to a scan angle within the frequency band as illustrated in graph B of FIG. 3. In this regard, the relationship as previously described between the frequency and the scan angle is given by expression (2), namely, $$S = \eta \lambda_o/4 \text{ SEC } i_o.$$

Figure 4:
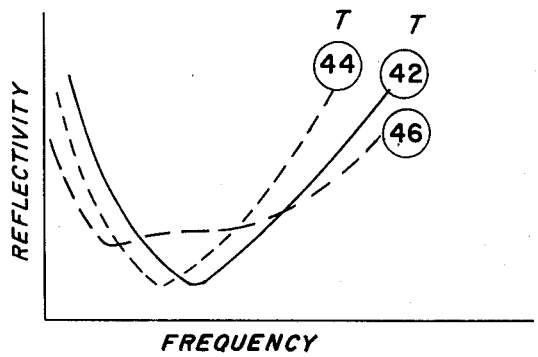
FIG. 4 is an envelope of frequency versus scan angle plots for analysis of testing radome patches according to the method of the present invention.

Now S equals the thickness of the radome wall which is, of course, constant with respect to a given radome patch. Thus, the resultant reflectivity versus frequency plot shown in graph A can be transposed because of analogy to simulate a plot of reflectivity versus scan angle as shown in graph B. In the preferred aspect of the method of the present invention, the reflectivity versus frequency plots, but preferably reflectivity versus scan angle plots, are produced for several development or field-exposed radomes and compared with each other to build up plot envelopes ranging from excellent to not acceptable. Moreover, for radome tuning, calibrating patches with deliberately thickened or thinned radome walls or cores can be used to diagnostically indicate the desirable radome improvements which can then be accomplished by manufacturing changes, post-manufacturing tuning or choice of operating frequency bands, etc. An enevelope of plots of freqency versus reflectivity is shown in FIG. 4 wherein graph lines 42 and 44 represent an envelope ranging from excellent to not acceptable patterns, respectively. Plot pattern 46 represents typically a pattern of a radome under testing which would show the failure of the radome to perform within the designed radio-frequency wavelength band.

Figure 5:
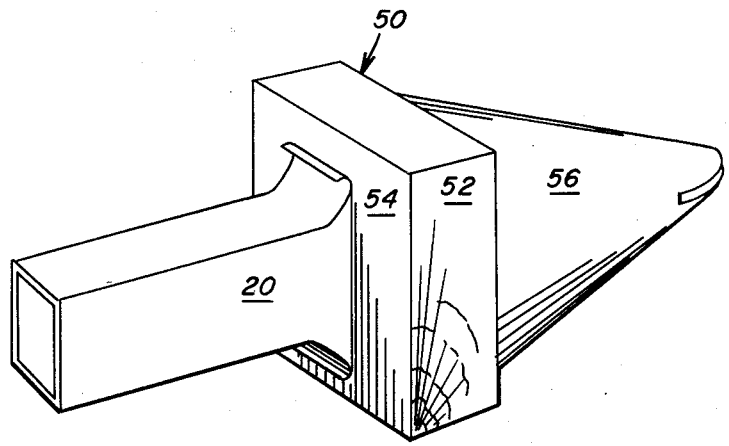
FIG. 5 illustrates an arrangement of parts for calibrating the apparatus to carry out the method of the present invention.

In calibrating the apparatus to carry out the method of the present invention, a sliding waveguide short may be used to set a zero-db reference level, but this fails to include the horn radiator. To assure a flat two-way response which includes the feedhorn, one desires a constant reflectivity versus frequency at, for example, −10 db or −20 db levels. A semi-infinite dielectric slab is suitable for this purpose and is approximated by a block of clear grain wood that is somewhat larger than the aperture in the horn 20. FIG. 5 illustrates the preferred form of calibrator block 50 shown in an operative relation with the E-plane sectoral horn 20. The calibrator block 50 has an enlarged squared end 52 which is larger than the transverse dimension of the sectoral horn. The face surface 54 of the block is planar for juxtapositioning of the horn 20 relative thereto. The calibrator block has a tapered conical end 56 extending from the squared end 52 to eliminate second-wall reflections. The calibrator is suitably made from clear grain Douglas fir having a dielectric constant $\epsilon$ of approximately 1.7 whereby the reflectivity is given by the expression:

$$\rho = \frac{\sqrt{\epsilon} - 1}{\sqrt{\epsilon} + 1} \quad (4)$$

to obtain a reflectivity of about −18 db. If desired, exit tapers can be cut into the block at the Brewster angle in the E-plane, although pyramidal E-H plane tapers may be used. Thus, the Brewster angle $\theta_B$ is given by the expression $$\theta_B = \text{Tan}^{-1}\sqrt{\epsilon}$$

or $$\theta_B 52° \quad (5)$$

In light of the foregoing, it can be seen that the concept of the present "Domesweeper" invention relates to a novel use of a sweep-frequency reflectometer in a method for testing radomes. In the method, it is necessary to alter the boundary wave into a compact, properly-collimated, reflection-free radiated wave in order to extract meaningful diagnostic reflectivity data from the radome under test.

Although the invention has been shown in connection with a certain specific embodiment, it will be readily apparent to those skilled in the art that various changes in form and arrangement of parts may be made to suit requirements without departing from the spirit and scope of the invention.

I claim as my invention:

1. A method for determining at a localized area radio-frequency performance including delamination and/or water entrapment or other material or thickness changes to a radome designed to pass electomagnetic waves at a prescribed frequency, said method including the steps of:
    illuminating by normal incidence a local radome patch with a sweep-frequency band of microwaves covering at least one-half octave centered, substantially, on said prescribed frequency,
    coupling a reflectometer for response to the band of illuminating and reflected microwaves directed onto and from said local radome patch, respectively,
    producing an X-Y plot corresponding to microwave reflectivity as a function of said microwave sweep-frequency, and
    calibrating said X-Y plot with a signal coresponding to the reflectivity of a dielectric slab, block or a radome patch with known radio-frequency performance.

2. The method according to claim 1 including the further step for transforming said plot by transposing said sweep-frequency band into a corresponding scan angle band using radome equations.

3. The method according to claim 2 wherein the wavelength of a microwave frequency within said sweep-frequency band is related to a corresponding scan angle, for A-sandwich radomes, by the expression:

$$S = \eta \, \lambda_o/4 \text{ SEC } i_o$$

where:
    $S$ = the thickness of the radome patch,
    $\lambda_o$ = the wavelength of said microwave frequency within said sweep-frequency band,
    $i_o$ = said scan angle, and
    $\eta$ = a constant.

4. The method according to claim 3 where $\lambda_o^1$ is the wavelength of a microwave frequency within said sweep-frequency band and $\lambda_o^1$ is given by the expression $$\lambda_o^1 = \lambda_o/3$$

where:

$$\eta = 3.$$

5. The method according to claim 1 wherein, for an A-sandwich radome, said sweep-frequency band of microwaves is selected to cover at least one-half octave centered substantially on the third harmonic of said prescribed frequency.

6. The method according to claim 1 wherein said illuminating a local radome patch includes directing said sweep-frequency band of microwaves from a sweep-frequency generator along a rectangular waveguide.

7. The method according to claim 6 wherein said illuminating a local radome patch further includes using an E-plane sectoral horn to radiate said sweep-frequency band of microwaves onto said local radome patch.

8. The method according to claim 7 wherein said E-plane sectoral horn is arranged in a juxtaposed relation with said local radome patch for normal incidence of the sweep-frequency band of microwaves.

9. The method according to claim 8 including the further step of calibrating said reflectometer by arranging a block of wood having one end larger than the aperture in said E-plane sectoral horn in a juxtaposed relation therewith while a tapered end projects outwardly from said horn to eliminate microwave second-surface reflections preparatory to said step of illuminating.

10. The method according to claim 1 wherein said step of comparing includes developing envelope patterns of known plot signals each corresponding to a radome patch with a known radio-frequency performance.

11. The method according to claim 1 including the further step of calibrating said reflectometer to develop a flat, two-way applicator response by the reflectometer preparatory to said step of illuminating.

* * * * *